(12) United States Patent
Mitsuishi et al.

(10) Patent No.: US 12,506,111 B2
(45) Date of Patent: Dec. 23, 2025

(54) ALIGNMENT METHOD AND ALIGNMENT APPARATUS

(71) Applicant: NIKON CORPORATION, Tokyo (JP)

(72) Inventors: Hajime Mitsuishi, Yokohama (JP); Minoru Fukuda, Tokyo (JP); Isao Sugaya, Kawasaki (JP)

(73) Assignee: Nikon Corporation, Tokyo (JP)

( * ) Notice: Subject to any disclaimer, the term of this patent is extended or adjusted under 35 U.S.C. 154(b) by 219 days.

(21) Appl. No.: 16/998,947

(22) Filed: Aug. 20, 2020

(65) Prior Publication Data

US 2020/0381387 A1 Dec. 3, 2020

Related U.S. Application Data

(63) Continuation of application No. PCT/JP2019/015865, filed on Apr. 11, 2019.

(30) Foreign Application Priority Data

Apr. 12, 2018 (JP) .................................. 2018-077151
May 9, 2018 (JP) .................................. 2018-091007

(51) Int. Cl.
*H01L 23/00* (2006.01)
*H01L 23/544* (2006.01)

(52) U.S. Cl.
CPC ............ *H01L 24/80* (2013.01); *H01L 23/544* (2013.01); *H01L 24/08* (2013.01); *H01L 24/74* (2013.01);
(Continued)

(58) Field of Classification Search
CPC ................... H01L 2224/08145–08148; H01L 2223/544–54433
See application file for complete search history.

(56) References Cited

U.S. PATENT DOCUMENTS 6,433,352 B1 8/2002 Oka
2006/0027318 A1 2/2006 Hashizume et al.
(Continued)

FOREIGN PATENT DOCUMENTS

JP 2011-159821 A 8/2011
JP 2011-216833 A 10/2011
(Continued)

OTHER PUBLICATIONS

Notice of Submission of Opinion from the Korean Patent Office, issued in the counterpart Korean Patent Application No. 10-2022-7006805 mailed May 4, 2022.
(Continued)

*Primary Examiner* — Khaja Ahmad
(74) *Attorney, Agent, or Firm* — Finnegan, Henderson, Farabow, Garrett & Dunner, L.L.P.

(57) ABSTRACT

An alignment method for aligning two substrates to be stacked, comprising measuring a position of a mark selected from plurality of marks disposed on at least one substrate of the two substrates and aligning the two substrates based on the position of the measured mark, wherein the mark to be measured is selected based on information relating to distortion of the at least one substrate. The mark may be a mark disposed in a region having a smaller distortion amount of the at least one substrate than a threshold. The mark may be a mark disposed in a region having a higher reproducibility of distortion that occurs in the at least one substrate than a threshold.

18 Claims, 19 Drawing Sheets

(52) U.S. Cl.
CPC ............... *H01L 2223/54426* (2013.01); *H01L 2224/08145* (2013.01); *H01L 2224/8013* (2013.01); *H01L 2224/80895* (2013.01); *H01L 2224/80896* (2013.01)

(56) References Cited

U.S. PATENT DOCUMENTS

| | | | |
|---|---|---|---|
| 2006/0085994 | A1 | 4/2006 | Yano |
| 2006/0273440 | A1* | 12/2006 | Okamoto .......... H01L 21/67253 257/E21.705 |
| 2013/0041494 | A1* | 2/2013 | Ausschnitt ........... G05B 19/401 700/98 |
| 2013/0141723 | A1* | 6/2013 | Wei ....................... G03F 9/7046 356/400 |
| 2014/0072774 | A1 | 3/2014 | Kito et al. |
| 2014/0224405 | A1 | 8/2014 | Kinouchi et al. |
| 2015/0083786 | A1 | 3/2015 | Okamoto et al. |
| 2015/0210057 | A1 | 7/2015 | Wagenleithner et al. |
| 2017/0278803 | A1 | 9/2017 | Sugaya et al. |
| 2020/0335472 | A1 | 10/2020 | Okamoto et al. |

FOREIGN PATENT DOCUMENTS

| | | |
|---|---|---|
| JP | 2012-019209 A | 1/2012 |
| JP | 2012-038860 A | 2/2012 |
| JP | 2013-098186 A | 5/2013 |
| JP | 2013-118369 A | 6/2013 |
| JP | 2014-116519 A | 6/2014 |
| JP | 2018-077151 A | 5/2018 |
| JP | 2018-091007 A | 6/2018 |
| KR | 10-2012-0019431 | 3/2012 |
| KR | 10-2014-0038968 A | 3/2014 |
| TW | 201351576 A | 12/2013 |
| TW | 201633367 A | 9/2016 |
| TW | 201739562 A | 11/2017 |
| TW | 201812839 A | 4/2018 |
| WO | 2015/066232 A1 | 5/2015 |
| WO | WO-2016093284 A1 * | 6/2016 ............ B23K 20/002 |
| WO | WO-2017168534 A1 * | 10/2017 ............. H01L 21/02 |
| WO | WO 2018/012300 A1 | 1/2018 |
| WO | WO 2019/198801 A1 | 10/2019 |

OTHER PUBLICATIONS

Office Action and Search Report issued by the Taiwan Intellectual Property Office on Sep. 8, 2022 in counterpart Taiwanese Patent Application No. 108112251, and English Translation thereof.

International Search Report of International Application No. PCT/JP2019/015865 dated Oct. 17, 2019.

Written Opinion of International Searching Authority for No. PCT/JP2019/015865 dated Oct. 17, 2019.

Decision of Rejection from the Taiwan Intellectual Property Patent Office, issued in the counterpart Taiwanese Patent Application No. 108112251 issued Jun. 17, 2023.

International Search Report issued on Sep. 5, 2017 by the Japanese Patent Office in counterpart International Application No. PCT/JP2017/023942, and English translation thereof.

Written Opinion of the International Searching Authority mailed Sep. 5, 2017 by the Japanese Patent Office in counterpart International Application No. PCT/JP2017/023942, and English translation thereof.

Notice of Reason for Refusal from the Japanese Patent Office, issued in the counterpart Japanese Patent Application No. 2022-070731 dated May 9, 2023, and English translation thereof.

Decision of Rejection issued by the Taiwanese Intellectual Property Office and mailed on Jul. 13, 2022 in counterpart Taiwanese Patent Application No. 110132954, and English Translation thereof.

Reason for Rejection issued by the Korean Intellectual Property Office and mailed on Jul. 25, 2022 in counterpart Korean Patent Application No. 10-2022-7012597, and English Translation thereof.

Notice of Preliminary Rejection issued by Korean Intellectual Property Office in counterpart Korean Patent Application No. 10-2018-7036761, having mailing date of Oct. 15, 2021.

Notice of Final Rejection from the Korean Intellectual Property Office, issued in the counterpart Korean Patent Application No. 10-2018-7036761 dated Mar. 17, 2022., and English translation thereof.

Office Action issued by the Taiwanese Intellectual Property Office in counterpart Taiwanese Patent Application No. 110132954, issued Feb. 8, 2022.

Office Action issued by the Japanese Patent Office and mailed on Mar. 23, 2021 in counterpart Japanese Patent Application No. 2018-5 2 7 512, and English Translation thereof.

Office Action issued by the Taiwan Intellectual Property Office on Nov. 9, 2020 in counterpart Taiwanese Patent Application No. 106122843, and English Translation thereof.

Office Action issued by the Taiwan Intellectual Property Office on Oct. 19, 2023 in counterpart Taiwanese Patent Application No. 110132954, and English Translation thereof.

International Search Report issued on Mar. 8, 2016 by the Japan Patent Office in counterpart International Application No. PCT/JP2015/084570, and the English translation thereof.

Written Opinion of the International Searching Authority issued on Mar. 8, 2016 in counterpart International Application No. PCT/JP2015/084570, and the English translation thereof.

* cited by examiner

ALIGNMENT METHOD AND ALIGNMENT APPARATUS

The contents of the following Japanese and International patent applications are incorporated herein by reference:
No. 2018-077151 filed in JP on Apr. 12, 2018;
No. 2018-091007 filed in JP on May 9, 2018; and
No. PCT/JP2019/015865 filed on Apr. 11, 2019.

BACKGROUND

1. Technical Field

The present invention relates to an alignment method and an alignment apparatus.

2. Related Art

There is a method for aligning other members such as mask patterns relative to a substrate based on the position of a mark disposed on said substrate (See, for example, Patent Document 1).
Patent Document 1: Japanese Unexamined Patent Application Publication No. 2013-118369

Significant processing load is required when using all the marks formed on a substrate to alignment with other members. On the other hand, by selecting a fewer number of marks than the total number of marks formed on the substrate to perform alignment with the selected marks. there were cases where the accuracy of the alignment with other members was reduced, depending on the selecting method.

SUMMARY

In a first aspect of the present invention, an alignment method for aligning two substrates to be stacked is provided, including measuring a position of a mark selected from plurality of marks disposed on at least one substrate of the two substrates and aligning the two substrates based on the position of the measured mark, wherein the mark to be measured is selected based on information relating to distortion of the at least one substrate.

In a second aspect of the present invention, an alignment method for aligning two substrates to be stacked is provided, including measuring a position of a plurality of marks disposed on at least one substrate of the two substrates, and aligning the two substrates based on the position of the plurality of measured marks, wherein the plurality of marks are marks disposed in a region having a smaller distortion amount of the at least one substrate than a threshold.

In a third aspect of the present invention, an alignment method for aligning two substrates to be stacked is provided, including measuring a position of a plurality of marks disposed on at least one substrate of the two substrates, and aligning the two substrates based on the position of the plurality of measured marks, wherein the plurality of marks are marks disposed in a region having a higher reproducibility of distortion that occurs in the at least one substrate than a threshold.

In a fourth aspect of the present invention, an alignment apparatus for aligning two substrates to be stacked is provided, including a measuring unit for measuring a position of a mark selected based on information relating to distortion that occurred in at least one substrate, among a plurality of marks disposed on at least the one substrate of the two substrates, and an aligning unit for aligning the two substrates based on the positions of the marks measured by the measuring unit.

In a fifth aspect of the present invention, an alignment apparatus for aligning two substrates to be stacked is provided, including a measuring unit for measuring a position of a plurality of marks disposed on at least one substrate of the two substrates an aligning unit for aligning the two substrates based on the position of the plurality of marks measured by the measuring unit, wherein the plurality of marks are marks disposed in a region having a smaller distortion amount of the at least one substrate than a threshold.

In a sixth aspect of the present invention, an alignment apparatus for aligning two substrates to be stacked is provided, including a measuring unit for measuring a position of a plurality of marks disposed on at least one substrate of the two substrates, and an aligning unit for aligning the two substrates based on the position of the plurality of marks measured by the measuring unit, wherein the plurality of marks are marks disposed in a region having a higher reproducibility of distortion that occurs in the at least one substrate than a threshold.

In a seventh aspect of the present invention, a substrate stacking apparatus is provided, including the above-described alignment apparatus according and a bonding portion for bonding the two substrates that is aligned by the alignment apparatus.

In an eighth aspect of the present invention, a stacked substrate manufacturing system is provided, including a selecting unit for selecting a mark to be measured, among a plurality of marks disposed on at least one substrate of two substrates to be stacked, based on information relating to distortion that occurred in the at least one substrate, and a substrate stacking apparatus for bonding the two substrates based on the positions of the marks selected by the selecting unit.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention. Not all the combinations of features described in the embodiments are essential for the present invention.

Figure 1:
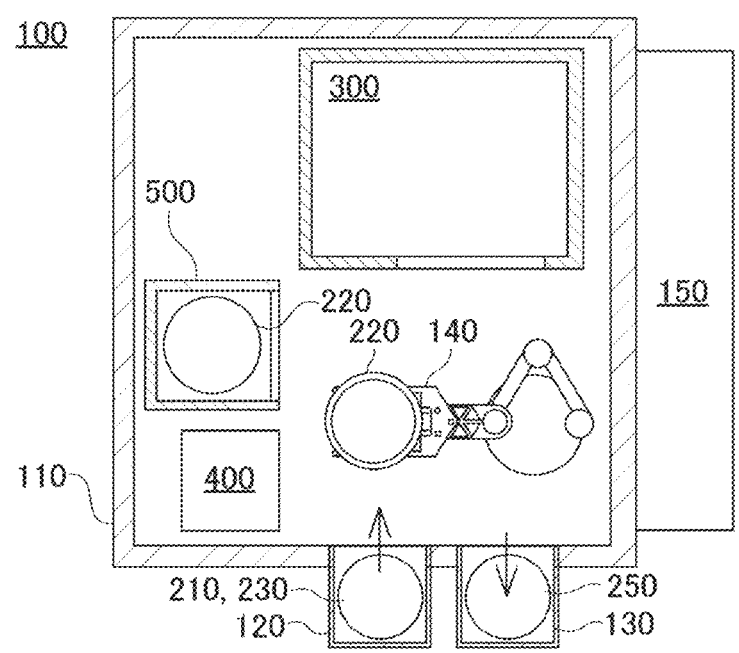
FIG. 1 is a schematic view illustrating the configuration of a substrate stacking apparatus 100.

FIG. 1 is a schematic plan view of a substrate stacking apparatus 100. The substrate stacking apparatus 100 includes a housing 110, substrate cassettes 120, 130 and a controlling unit 150 disposed outside the housing 110, a conveying unit 140 disposed inside the housing 110, a bonding portion 300, a holder stocker 400, and a prealigner 500. In the substrate stacking apparatus 100, the bonding portion 300 and the controlling unit 150 form an example of an alignment apparatus.

In the substrate stacking apparatus 100, one of the substrate cassettes 120 accommodates the substrates 210, 230 to be bonded. The other substrate cassette 130 accommodates a stacked substrate 250 formed by bonding the substrates 210, 230. The substrate cassettes 120, 130 are individually detachable to the housing 110.

The conveying unit 140 conveys the individual substrates 210, 230, and the substrate holder 220, inside the housing 110. In addition, the conveying unit 140 conveys the substrate holder 220 holding the substrates 210, 230, and the stacked substrate 250 formed by stacking the substrates 210, 230, inside the housing 110.

The controlling unit 150 individually controls the operation of each unit of the substrate stacking apparatus 100, as well as integrally controls the mutual cooperation of each unit. In addition, the controlling unit 150 receives a user instruction from the outside and sets a condition to manufacture the stacked substrate 250. In addition, controlling unit 150 has a user interface for displaying, to the outside, the operating state of the substrate stacking apparatus 100

The bonding portion 300 has a pair of stages opposed to each other, which also serves as an aligning unit for aligning the substrates 210, 230 held in each of the stages with each other. In addition, the bonding portion 300 forms the stacked substrate 250 by contacting the aligned substrates 210, 230 with each other.

Note that, aligning the substrates 210, 230 means to adjust the relative position in the plane direction of the substrates 210, 230 so that the corresponding marks 213 provided on the substrates 210, 230 coincides with each other. For various reasons described below, even in case where the positions of the marks 213 do not completely coincide, reducing the relative position to a degree that electrical connection by electrodes, pads, bumps, or the like provided on the substrates 210, 230, for example, is formed is also included in the aligning.

Inside the substrate stacking apparatus 100, the substrate holder 220 may be handled with the substrates 210, 230 held therein. The substrate holder 220 is formed of hard material such as alumina ceramics, and has a retaining surface for holding the substrates 210, 230, and an edge disposed on the outside of the retaining surface.

The thin and fragile substrates 210, 230 can be prevented from being damaged and the operation of the substrate stacking apparatus 100 can be accelerated by holding the substrates 210, 230 with the substrate holder 220 by means of vacuum chuck, electrostatic chuck, or the like provided in the substrate holder 220, and handling the substrates 210, 230 via the substrate holder 220 at the back surface of the retaining surface or the edge thereof. In the substrate stacking apparatus 100, a plurality of substrate holders 220 are accommodated in the holder stocker 400.

When exporting the substrates 210, 230 or the stacked substrate 250 from the substrate stacking apparatus 100, the substrate holder 220 is separated from the substrates 210, 230 or the stacked substrate 250, and is returned to the holder stocker 400. In this way, the substrate holder 220 remains inside without being exported to the outside of the substrate stacking apparatus 100, and is repeatedly used. Therefore, it can be said that the substrate holder 220 is a part of the substrate stacking apparatus 100. Moreover, the substrate holder 220 can also be taken out from the substrate stacking apparatus 100 for the purpose of maintenances including cleaning, replacement, or the like.

The prealigner 500 cooperates with the conveying unit 140 and holds the imported substrates 210, 230 in the substrate holder 220. In addition, the prealigner 500 is also used when separating, from the substrate holder 220, the stacked substrate 250 exported from the bonding portion 300.

Examples of the substrates 210, 230 are substrates with elements, circuits, terminal or the like formed thereon, unprocessed silicon wafer, compound semiconductor wafer, sapphire substrate, glass substrate. In addition, structures such as elements, wirings, scribe lines, marks may be formed on a semiconductor wafer, and in such cases, a semiconductor wafer with structures formed thereon becomes an object to be aligned. The set of substrates 210, 230 to be bonded may be a circuit substrate and an unprocessed substrate, or may both be unprocessed substrates. The substrates 210, 230 to be bonded may themselves be the stacked substrate 250 already formed by stacking a plurality of substrates. In the present embodiment, the substrates 210, 230 are semiconductor wafers with circuits or the like formed thereon.

Note that, bonding the substrates 210, 230 means to pile the principal surfaces of the plurality of substrates 210, 230 parallel to each other, and fixing their positions relative to each other by means of hydrogen bond, van der Waals bond, covalent bond, and the like. On the other hand, piling the substrates 210, 230 means to bring the principal surfaces of the plurality of substrates 210, 230 into contact with each other, but does not necessarily mean that their positions relative to each other is fixed. In addition. "stacking" and "piling" may be used synonymously. Note that, the substrates 210, 230 may start bonding where they are stacked, but may be exported from the bonding portion 300 while the bonding proceeds and may complete the bonding at a location that is different from where they were aligned. In addition, the substrates 210, 230 may be bonded by means of heating, pressurizing, or the like, at a location that is different from where they were aligned.

Figure 2:
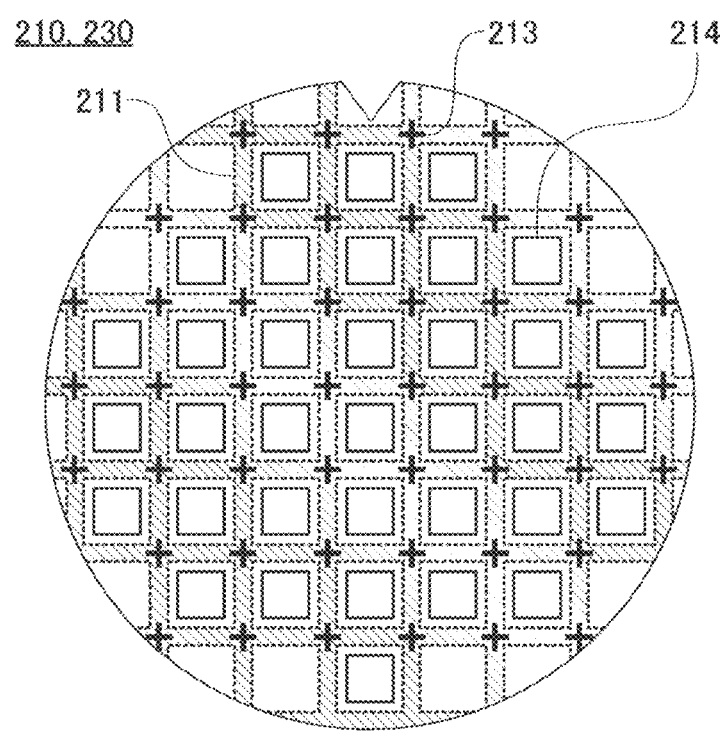
FIG. 2 is a schematic plan view of substrates 210, 230.

FIG. 2 is a schematic plan view of substrates 210, 230 forming the stacked substrate 250. The substrates 210, 230 include scribe lines 211, marks 213, and circuit regions 214. The marks 213 and the circuit regions 214 are each provided in multiple.

The marks 213 are exemplary structures formed on surfaces of the substrates 210, 230, and the marks 213 are disposed over the scribe lines 211 disposed between the individual circuit regions 214 in the illustrated example. The marks 213 are used as an alignment reference in case where the substrate 210 is bonded to another substrate 230. A number of marks 213 are formed on the surface of the substrate 210, but not all marks 213 are necessarily used when aligning the substrates 210, 230.

The marks 213 refer to structures used as indicators in case where relative positions in the plane direction, relative to structures formed on the substrates, are measured. The marks 213 may be formed as a part of the elements or wirings. In addition, the marks 213 may be formed for the purpose of being solely used as indicators, such as patterned metal layers. Moreover, the marks 213 may be protrusions, ridges, steps, grooves, holes, or the like formed by processing the substrates 210, 230 themselves, in addition to being formed by metal layers deposited on the surfaces of the substrates.

A plurality of circuit regions 214 having identical structures are disposed at regular intervals or in a matrix form on the surfaces of the substrates 210, 230. Each of the circuit regions 214 is provided with structures, such as elements, wiring and overcoat, formed by photolithographic technique and the like. In addition, on the circuit regions 214, connection portions such as pads and bumps are also disposed on the circuit region 214, which act as connection terminals when the substrate 210 is electrically connected to another substrate 230, a lead frame, and the like. The connection portions are also an example of the structures formed on the front surface of the substrates 210, 230.

Figure 3:
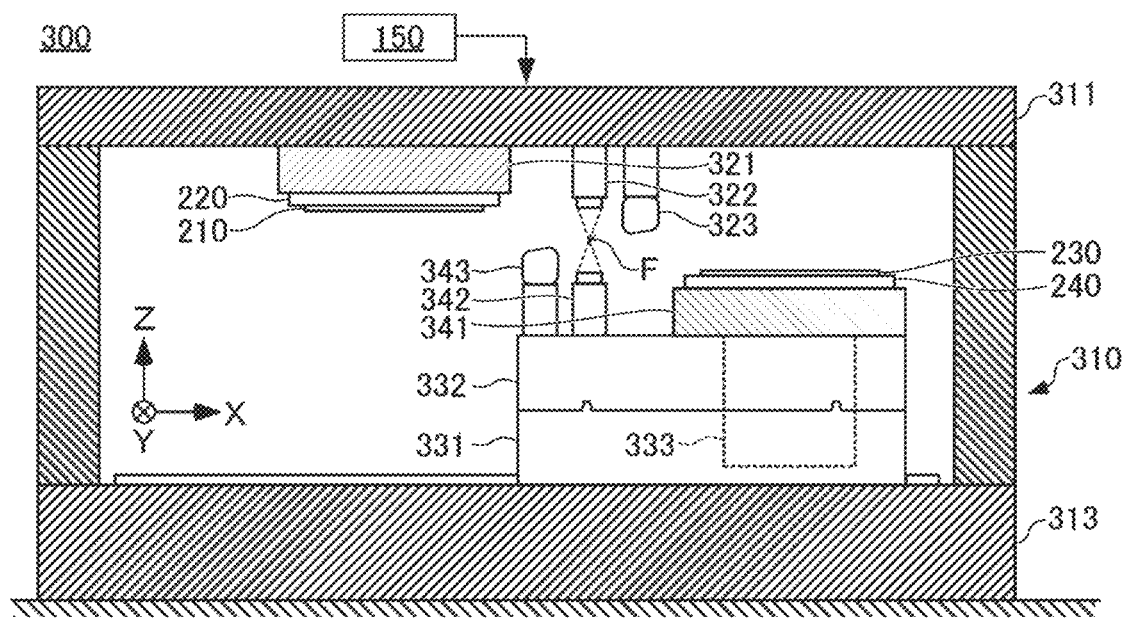
FIG. 3 is a schematic cross sectional view illustrating the structure of a bonding portion 300.

FIG. 3 is a schematic cross sectional view illustrating the structure of a bonding portion 300 in the substrate stacking apparatus 100. In addition, FIG. 3 also illustrates the state immediately after the two substrates 210, 230 are imported in the bonding portion 300.

The bonding portion 300 includes a frame 310, a fixed stage 321, and a movable stage 341. The frame 310 includes a ceiling plate 311 and abase plate 313 that are each horizontal. The bonding portion 30 is connected to the controlling unit 150, and operates under control of the controlling unit 150.

The fixed stage 321 is fixed downwardly to the ceiling plate 311 of the frame 310, and sucks and holds the substrate holder 220 holding the substrate 210. The substrate holder 220 held in the fixed stage 321 is imported to the bonding portion 300 such that the bonded surface of the substrate 210 faces illustratively downward, and is held downwardly also in the fixed stage 321.

An upper microscope 322 and an upper activation device 323, fixed to face illustratively downward, are disposed beside the fixed stage 321 on the illustratively lower surface of the ceiling plate 311 of the frame 310. The upper microscope 322 observes the upper surface of the other substrate 230 mounted on the movable stage 341 disposed to oppose the fixed stage 321. The upper activation device 323 generates plasma, for example, and cleans or activates the upper surface of the substrate 230 held in the movable stage 341.

In the bonding portion 300, the X-direction driving unit 331, a Y-direction driving unit 332, and the movable stage 341 are disposed in a stacked manner on the illustratively upper surface of a base plate 313 of the frame 310. The substrate holder 240 holding the substrate 230 is held on the illustratively upper surface of the movable stage 341.

The X-direction driving unit 331 moves in parallel with the base plate 313 in the direction indicated by arrow X in the figure. The Y-direction driving unit 332 moves on the X-direction driving unit 331 in parallel with the base plate 313, in the direction indicated with the arrow Y in the figure. The movable stage 341 moves two-dimensionally in parallel with the base plate 313 by the combined operation of the X-direction driving unit 331 and the Y-direction driving unit 332.

Further, a Z-direction driving unit 333 is disposed between the Y-direction driving unit 332 and the movable stage 341. The Z-direction driving unit 333 moves the movable stage 341 relative to the Y-direction driving unit 332 in the direction indicated by arrow Z, perpendicular to the base plate 313. In this way, the movable stage 341 is moved up and down. The amount of movement of the movable stage 341 by the X-direction driving unit 331, the Y-direction driving unit 332 and the Z-direction driving unit 333 is accurately controlled using an interferometer or the like.

The lower microscope 342 and the lower activation device 343 are mounted beside the movable stage 341 on the illustratively upper surface of the Y-direction driving unit 332. The lower microscope 342 moves together with the Y-direction driving unit 332, and observes the lower surface of the substrate 210 facing downward held in the fixed stage 321. The lower activation device 343 generates plasma, for example, with which the substrate 210 is irradiated to clean or activate the illustratively lower surface of the substrate 210 held in the fixed stage 321, while moving together with the Y-direction driving unit 332.

Note that, the activation of the substrates 210, 230 includes cases where the bonded surface of at least one substrate is processed to be bonded in a solid phase without melting, by generating hydrogen bond, van der Waals bond, covalent bond or the like, when the bonded surface of the substrate 210 contacts the bonded surface of the other substrate 230. That is, activation includes facilitating formation of bonds by generating dangling bond (uncombined hand) on the surfaces of the substrates 210, 230.

More specifically, in the upper activation device 323 and the lower activation device 343, oxygen gas which is a treatment gas is excited and turned into plasma under reduced pressure atmosphere, for example, and surfaces to be the bonded surface of each of the two substrates are irradiated with oxygen ion. For example, in case where the substrate is a substrate with a SiO film formed on Si, due to radiation of the oxygen ion, the bond of SiO on the substrate surface which becomes the bonded surface upon stacking is disrupted and dangling bond of Si and O is formed. Forming such dangling bonds on the surface of a substrate may be referred to as activation.

When a substrate with a dangling bond formed thereon is exposed to the atmosphere, for example, water in the air is bound to the dangling bond and substrate surface is covered with hydroxyl group (OH group). The surface of the substrate becomes easier to bind to water molecule, that is, becomes easier to be hydrophilized. That is, the surface of the substrate becomes easier to be hydrophilized as a result of the activation. In addition, for solid phase bonding, bonding strength is affected by the presence of impurities such as oxides in the bonding interface, defect in the bonding interface or the like. Therefore, cleaning the bonded surface may be regarded as a part of activation.

Examples of a method for activating the substrates 210, 230 may include, for example, radical irradiation with DC plasma, RF plasma, MW excitation plasma, as well as sputter etching with inactive gas and irradiation of ion beam, fast atomic beam or the like. In addition, activation by means of UV irradiation, ozone asher or the like may also be included. Further, chemical cleaning process using liquid or gas etchant may also be included.

Further, activation of the substrates 210, 230 may hydrophilize the surface of the substrates 210, 230 by applying pure water or the like to the surfaces which becomes the bonded surface of the substrates 210, 230, using hydrophilizing apparatus that is not illustrated. This hydrophilization allows the surfaces of the substrates 210, 230 to have an OH group attached thereto, that is, to be terminated with an OH group.

Note that, instead of the upper activation device 323 and the lower activation device 343, a different activation apparatus may be provided at a place other than the bonding portion 300, and the substrates 210, 230 may be activated before being imported into the bonding portion 300.

The bonding portion 300 further includes the controlling unit 150. The controlling unit 150 controls the operation of the X-direction driving unit 331, the Y-direction driving unit 332, the Z-direction driving unit 333, the upper activation device 323, and the lower activation device 343.

Note that, prior to bonding the substrates 210, 230, the controlling unit 150 pre-calibrates the relative positions of the upper microscope 322 and the lower microscope 342. The calibration of the upper microscope 322 and the lower microscope 342 can be performed by, for example, focusing the upper microscope 322 and the lower microscope 342 at a common focal point F, so that they observe it. Alternatively, the upper microscope 322 and the lower microscope 342 may observe a common reference object.

Figure 4:
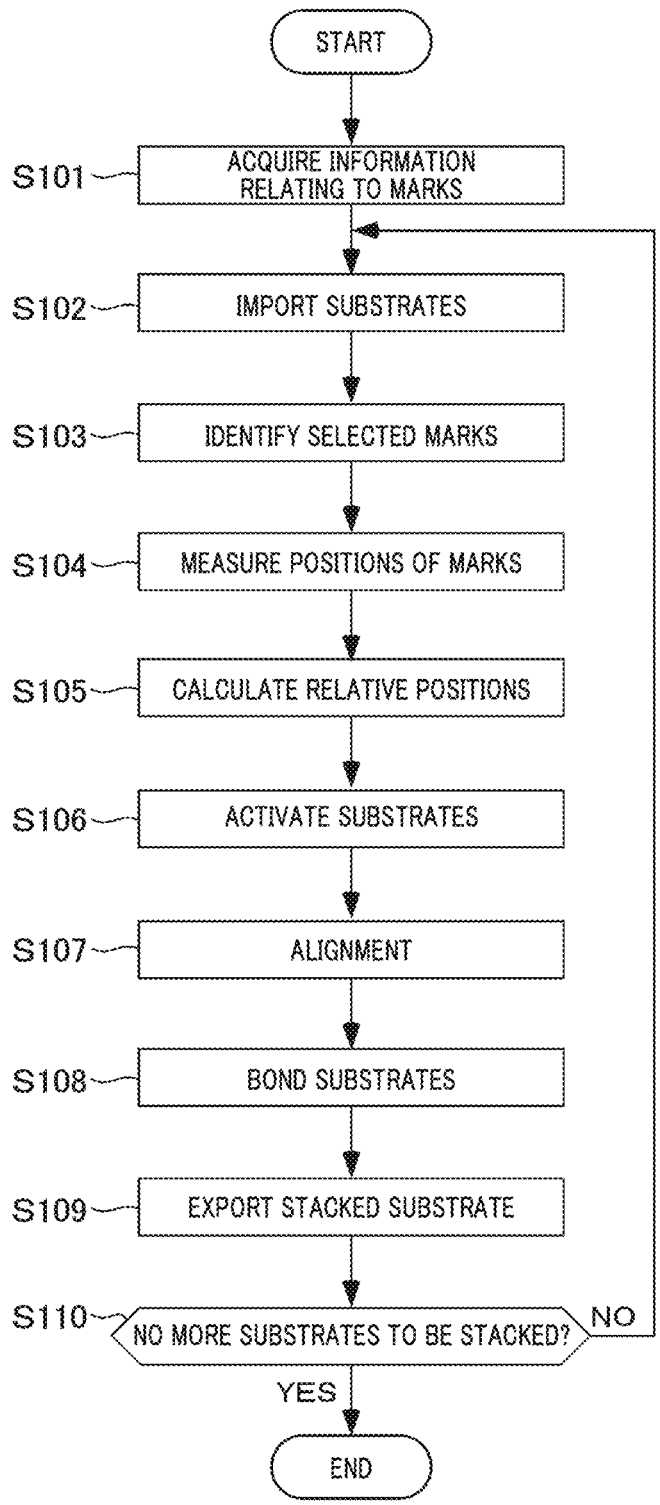
FIG. 4 is a flow diagram illustrating the procedure for aligning the substrates 210, 230.

FIG. 4 is a flow diagram illustrating the procedure for aligning and stacking the substrate 210 with the other substrate 230. When stacking the substrates 210, 230, the controlling unit 150 first acquires information relating to the marks 213 to be used for the alignment (step S101).

Information relating to the marks 213 is information to be referred to when individually identifying particular marks 213 which is fewer than the total number of the marks 213 provided on the substrates 210, 230. Specifically, information to individually identify the marks 213 may include, for example, information indicating the position or region on the substrates 210, 230 relative to the notch of the substrates 210, 230. In addition, it may be information indicating differences in the shape of the marks 213, symbols, letters, figures, or the like provided on the substrates 210, 230 with the marks 213. Which ones of the total number of marks 213 are selected as the particular marks 213 will be described below. Here, the description is continued with the assumption that the particular marks 213 are pre-selected and identified by the above-described information.

The above-described information may be, for example, information that is predetermined based on the result of the actual measurement of displacement of the marks 213, for another substrate having the same specification as each of the substrates 210, 230. In this case, the controlling unit 150 acquires the above-described information by having information relating to the positions of the regions input from the outside.

In addition, information acquired by the controlling unit 150 may include information relating to the manufacturing conditions such as the content or history of the processing that the substrate 210 has undergone before being imported to the substrate stacking apparatus 100, information on the cause of distortion of the substrates 210, 230, such as the material, specification, manufacturing process condition, crystal orientation of the substrates, or the like, as information relating to distortion. Here, manufacturing process condition includes exposure condition for exposure apparatuses, film forming condition for film forming apparatuses, grinding condition for grinding apparatuses, and activating condition for activation apparatuses.

In addition, information relating to the substrates 210, 230 may include, for example, information relating to the specification of the substrates 210, 230 as well as the amount of deformation such as a bend, as the information relating to distortion of the substrates. In this way, the controlling unit 150 can generate, for the substrates 210, 230 to be imported at the next step S102, compensation condition for the alignment to improve the alignment accuracy by compensating for deformation of the substrates, by means of analysis based on the acquired information. Note that, information relating to deformation of the substrates may be generated as information obtained by providing the substrate stacking apparatus 100 with a measuring unit and measuring the deformation amount each time for the imported substrates 210, 230.

Figure 5:
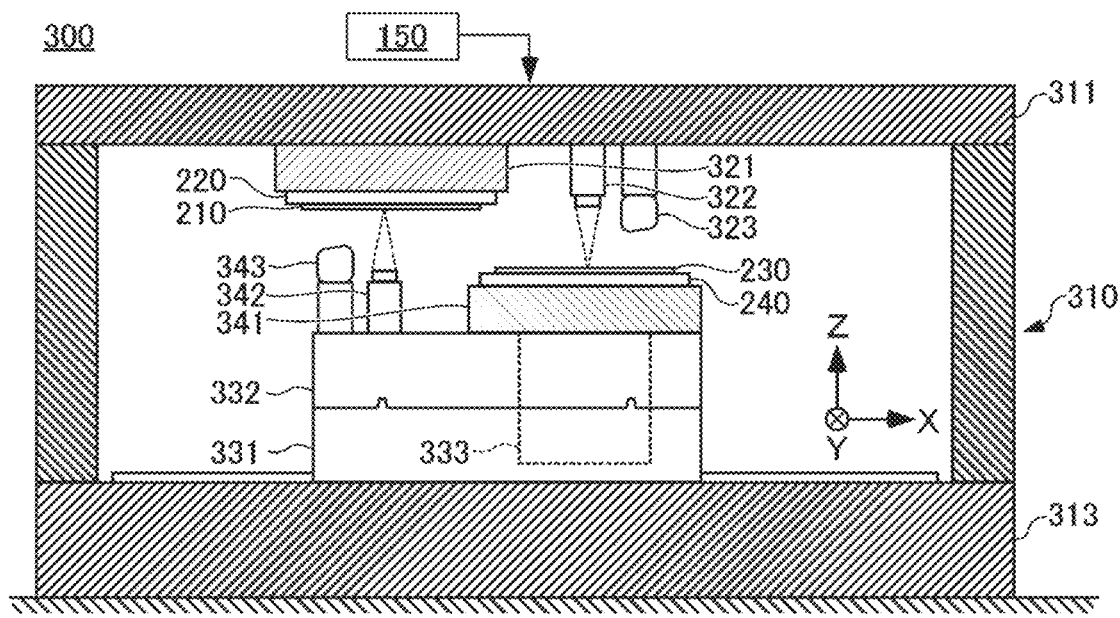
FIG. 5 is a schematic cross sectional view illustrating the operation of the bonding portion 300.

The controlling unit 150 then controls the conveying unit 140 and sequentially imports the substrates 210, 230 to the bonding portion 300 (step S02). Further, as shown in FIG. 5, the controlling unit 150 moves the movable stage 341, thereby observing each of the substrates 210, 230 using the lower microscope 342 or the upper microscope 322 and identifying the marks 213 to use for the alignment of the substrates 210, 230 (step S103).

Here, the controlling unit 150 estimates the positions of the marks 213 disposed on the substrates 210, 230 to use for the alignment of the substrate 210 by referring to the information acquired at step S101, and moves the movable stage 341 so that said position can be observed with the lower microscope 342 or the upper microscope 322. The controlling unit 150 then sequentially scans around the predicted position to identify the marks 213 found within the searched region as the marks 213 to use for the alignment.

Since the initial value of the relative positions of the upper microscope 322 and the lower microscope 342 are known, the controlling unit 150 then measures the position of the particular marks 213 based on the amount of movement of the movable stage 341 that has been moved to identify the marks 213 (step S104). Further, the controlling unit 150 calculates the positions of the substrates 210, 230 relative to each other, based on the positions of the measured marks 213 (step S105).

The controlling unit 150 then calculates the amount of movement of the movable stage 341 needed for the alignment of the substrates 210, 230, based on the calculated relative positions. The amount of movement needed for the alignment are calculated by known methods such as EGA (enhanced global alignment), for example, as a value in the x-direction, y-direction, and rotation angle θ, for example.

In this way, the controlling unit 150 becomes in a state where perform alignment of the substrates 210, 230 can be performed by using the identified marks 213 as a reference.

Here, the state where alignment can be performed means to perform statistical processing such that the difference between the positions of the plurality of marks 213 identified in each of the substrates 210, 230 is minimized, and to calculate the amount of movement, rotation amount and magnification for at least one of the substrates 210, 230.

More specifically, the amount of movement (x, y) and the rotation amount (θ) in the X-direction and Y-direction at which the misalignment amount relative to the designed position is minimal is calculated for each of the substrates 210, 230. In this way, the substrates 210, 230 can be relatively moved, including rotation, to minimize the misalignment.

The alignment of the substrates 210, 230 causes each of the substrates 210, 230 to individually move and rotate towards a reference position according to the designed position, in case where each of the substrates 210, 230 are individually movable. In addition, as shown in FIG. 3 and the like, in case where only one of the substrates 230 is movable, alignment can be performed by adding the difference between each of the substrates 210, 230 and the reference position and moving the one substrate 230 such that the relative positions of the substrates 210, 230 are minimal.

The controlling unit 150 then scans the surfaces of the substrates 210, 230 with plasma to activate the bonded surfaces of the substrates 210, 230 by moving the movable stage 341 with the upper activation device 323 and the lower activation device 343 operating, while retaining the information on the amount of movement of the substrates 210, 230 calculated for the alignment (step S106). The activated surfaces of the substrates 210, 230 become bonded by contact without processing such as included matters such as adhesive bond, welding, clamping or the like.

Figure 6:
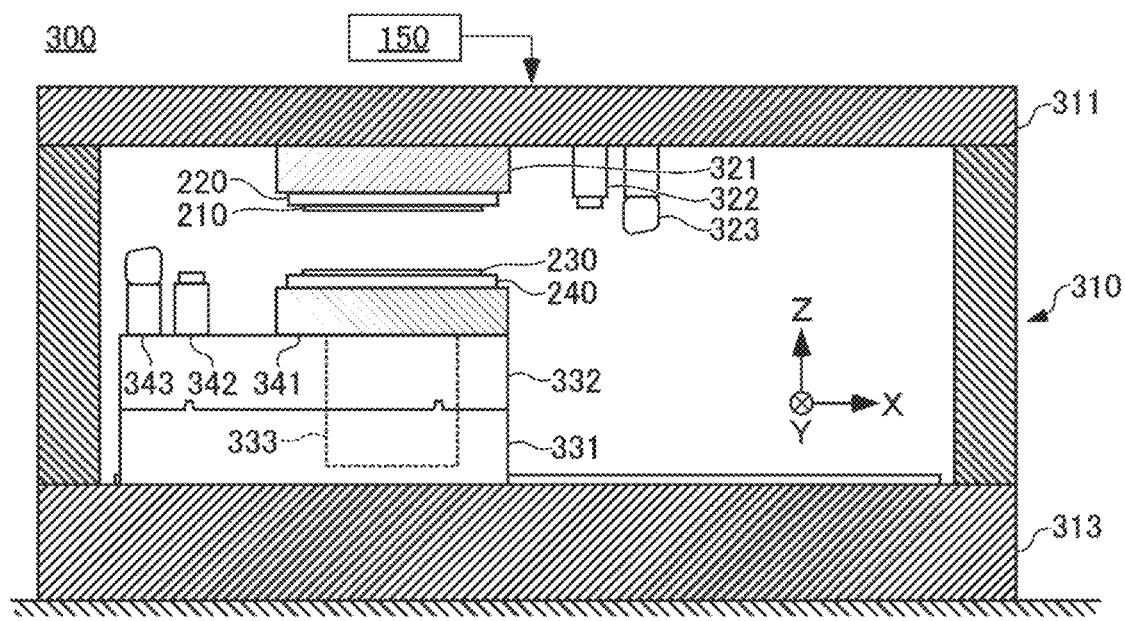
FIG. 6 is a schematic cross sectional view illustrating the operation of the bonding portion 300.
Figure 7:
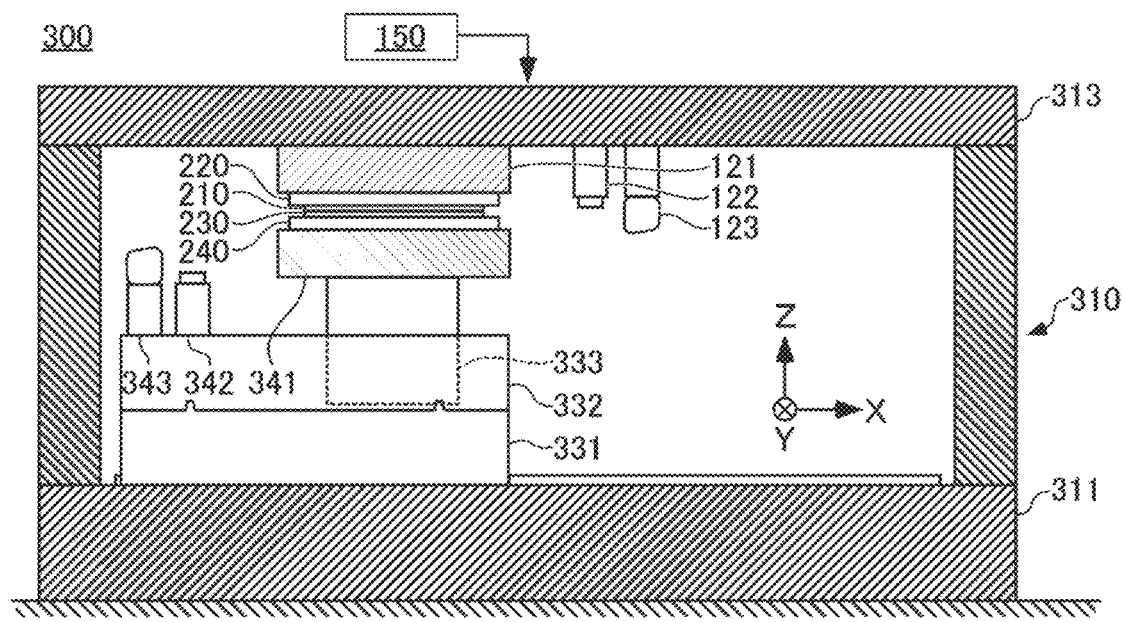
FIG. 7 is a schematic cross sectional view illustrating the operation of the bonding portion 300.

The controlling unit 150 then moves the movable stage 341 based on the relative position previously calculated at step S105 to align the substrates 210, 230 with each other as shown in FIG. 6 (step S107). Further, the controlling unit 150 operates the Z-direction driving unit 333 to elevate the movable stage 341 as shown in FIG. 7. Thus, the substrate 230 is elevated, and the substrates 210, 230 eventually contact each other.

The substrates 210, 230 whose surfaces has been activated at step S106 are bonded by hydrogen bond, van der Waals bond, covalent bond and the like generated by contact, to form a stacked substrate 250 (step S108). The stacked substrate 250 so formed is exported from the bonding portion 300 (step S109). Further, the stacked substrate 250 is accommodated in the substrate cassette 130 after being separated from the substrate holder 240.

Note that, in case where the two substrates 210, 230 are hydrogen bonded by contact between each other, after the stacked substrate 250 is formed, covalent bond may be generated between the substrates 210, 230 by importing the stacked substrate 250 to a heating apparatus such as an annealing furnace and heating it therein. In this way, the bonding strength between the substrates 210, 230 can be improved.

The controlling unit 150 then investigates whether the substrates 210, 230 to be stacked has been removed from the substrate cassette 120 (step S110). If the substrates 210, 230 to be stacked still exists (step S110: NO), the controlling unit 150 returns the procedure to step S102 and repeats the series of stacking procedure of steps S102 to S109. At step S110, if it is determined that the substrates 210, 230 to be stacked has been removed (step S110: YES), the controlling unit 150 ends the control of the substrate stacking apparatus 100.

As described above, the bonding portion 300 can align the substrates 210, 230 by using the marks 213 provided on the substrates 210, 230 as a reference. However, at the time of bonding at the bonding portion 300, the positions of the marks 213 of the substrates 210, 230 may be displaced relative to the designed position due to the distortion that occurred in the substrates 210, 230.

Thus, the alignment accuracy may be reduced in case where the substrates 210, 230 are aligned depending on the positions of the marks 213. However, when selecting the marks 213 to be used for the alignment among the marks 213 formed on the substrates 210, 230, the drop in the alignment accuracy due to deformation of the substrate can be suppressed by performing the selection in a method as described below.

Note that, the distortion that occurs in the substrates 210, 230 is the deformation that displaces the structures in the substrates 210, 230 from the designed coordinate, that is, the designed position. The distortion that may occur in the substrates 210, 230 includes plane distortion and steric distortion.

Plane distortion is a distortion that occurs in the plane direction of the substrates 210, 230, and includes linear distortion and non-linear distortion. Linear distortion is a distortion in which the displaced position from the designed position of the structures on the substrates 210, 230 due to distortion can be expressed by linear transformation. Non-linear distortion means a distortion that cannot be expressed by linear transformation, which occurs due to crystal anisotropy of the substrates 210, 230 and processing during a manufacturing process of the substrates 210, 230. Further, non-linear distortion may occur during the process of bonding or the like of the substrates 210, 230, depending on the stiffness distribution due to the arrangement of the structures formed on the substrates 210, 230.

Linear distortion includes magnification distortion and orthogonal distortion. Magnification distortion is a distortion in which the displacement amount of the structures increases radially from the center of the substrates 210, 230 at a constant increasing rate. The value of magnification distortion is obtained by dividing the amount of deviation from the designed position at a distance r from the center of the substrates 210, 230 by r, and is expressed in ppm.

Magnification distortion includes isotropic magnification distortion. Isotropic magnification distortion is a distortion in which the X-component and the Y-component of the displacement vector of the structure due to distortion are equal. Thus, in case where isotropic magnification distortion occurs, the magnification in the X-direction and the magnification in the Y-direction of the substrates 210, 230 are equal. Non-isotropic magnification distortion is included in non-linear distortion, and the X-component and the Y-component of the displacement vector from the designed position of the structure are different. Thus, the magnification in the X-direction and the magnification in the Y-direction of the substrates 210, 230 are different. A difference in magnification distortion in each of the two substrates 210, 230 is included in the misalignment amount that occurs between the two substrates 210, 230 when stacking.

Orthogonal distortion is a distortion in which the structure is displaced in a direction parallel to the X-axis from the designed position when an orthogonal coordinate X-Y is set with the center of the substrate as the origin, which becomes larger as the structure becomes farther from the origin in the Y-axis direction. In addition, the displacement amount of the structure due to orthogonal distortion is the same in each of a plurality of regions which cross the Y-axis in a direction parallel to the X-axis and the absolute value of the displacement amount increases as it is farther from the X-axis. In addition, for the displacement amount due to orthogonal distortion, the direction of displacement in the positive side relative to the Y-axis and the direction of displacement in the negative side relative to the Y-axis are opposite to each other.

In contrast to the above-described plane distortion, steric distortion that occurs in the substrates 210, 230 is distortion in which displacement of the structures occurs in a direction that intersects with the surfaces of the substrates 210, 230, and includes a curve. The curve is a distortion in which the substrates 210, 230 are entirely or partially flexed, and the entire substrates 210, 230 or portions thereof are flexed. Flexing means to change the shape so that a point that does not exist on a plane specified by three points on the surfaces of the substrates 210, 230 is included in the surface of the substrates 210, 230.

In addition, a curve is a distortion in which the surfaces of the substrates 210, 230 forms a curved surface, and includes a bend. A bend refers to a distortion that remains in the substrates 210, 230 with the effect of gravity on the distortion of the substrates 210, 230 eliminated. The distortion in which a bend occurs in the substrates 210, 230 when the bend is under the effect of gravity is referred to as a flexure in the present example. The bend includes a global bend in which the entire substrates 210, 230 are bent at a generally uniform curvature, and a local bend in which part of the substrates 210, 230 are bent with varying curvature.

The above-described magnification distortion can be classified into initial magnification distortion, sucking magnification distortion, and laminating process magnification distortion, depending on the cause of generation.

The initial magnification distortion is a distortion that has already occurred in the individual substrates 210, 230 before the stacking step, and is generated by stress that occurred during a process of forming the marks 213, the circuit region 214 or the like on the substrates 210, 230, a periodic change in stiffness due to the arrangement of the scribe lines 211, circuit regions 214 or the like. The initial magnification distortion is manifested as the position of the structures on the substrates 210, 230 being different from the designed position in the substrates 210, 230. The initial magnification distortion may be known before starting the stacking of the substrates 210, 230. Information relating to the initial magnification distortion may be acquired by measuring the substrates 210, 230 immediately before stacking, or the information measured at the manufacturing step of the substrates 210, 230 may be acquired at the stacking step.

The sucking magnification distortion is a distortion that occurs in case where the shape of the substrates 210, 230 and the shape of the sucking surface of the substrate holders 220, 240 or the like that holds the substrates 210, 230 are different. The substrates 210, 230 turns into a shape that follows the sucking surfaces of the retaining members, when the retaining members such as the substrate holders 220, 240 suck the substrates 210, 230 with holding mechanisms such as electrostatic chucks, vacuum chuck or the like. Thus, in case where the shape of the substrates 210, 230 and the shape of the sucking surfaces of the retaining members are different, the substrates 210, 230 are deformed by sucking the substrates 210, 230 onto the retaining members to change the distortion state.

Note that, the magnitude of the sucking magnification distortion can be calculated from the distortion state including bending amount and bending shape or the like of the substrates 210, 230, by investigating the correlation of the distortion and the sucking magnification distortion in advance, in case where there is a distortion such as bending in the substrates 210, 230. Therefore, the sucking magnification distortion may be positively utilized for distortion correction of the substrates 210, 230, by adjusting the shape of the sucking surfaces by preparing a plurality of retaining members having sucking surfaces with different shapes.

The laminating process magnification distortion is a magnification distortion that newly occurs during the stacking and laminating process of the substrates 210, 230. When laminating the substrates 210, 230, the bonding of the substrates 210, 230 starts at a part of the bonded surface of the substrates 210, 230, and spreads eventually to generally the entire substrates 210, 230. Thus, in the substrates 210, 230 during the bonding process, deformation occurs in at least one of the substrates 210, 230 near the boundary between a region where it is already bonded and adhered to the other substrate and a region where it is not in contact with the other substrate and is to be bonded. Part of the deformation that occurred is fixed by the substrates 210, 230 being laminated to each other, and becomes the laminating process magnification distortion.

Figure 8:
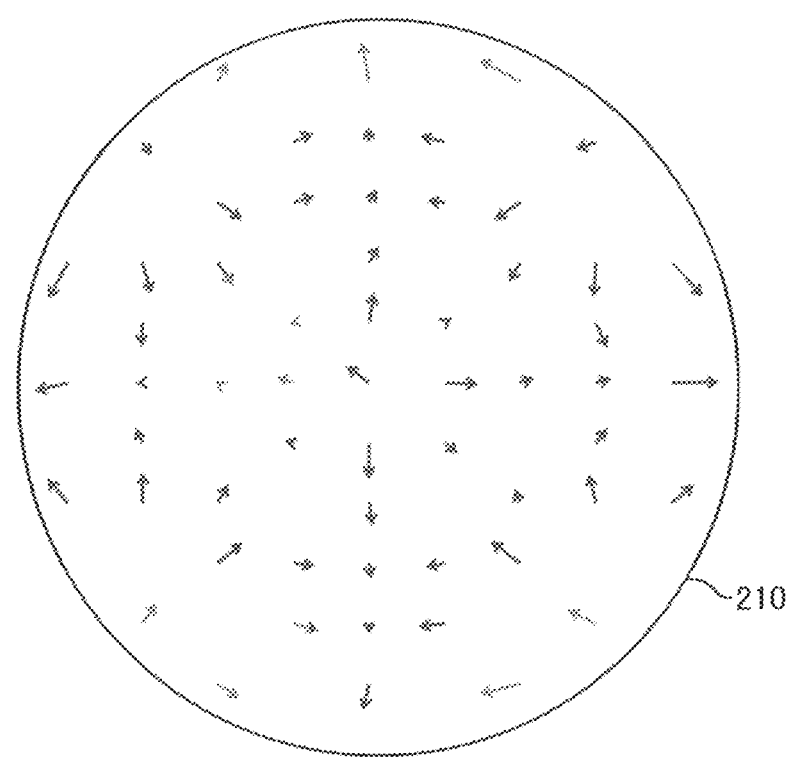
FIG. 8 illustrates the distribution of the non-linear components of deformation that occurred in the substrate 210.

Next, with reference to FIG. 8 and FIG. 9, a method for selecting the marks 213 to be used for the alignment, among the plurality of marks 213 on the substrate 210, will be described. FIG. 8 illustrates, by the vector, the displacement of a plurality of points on the surface of the substrate 210 due to non-linear components of the deformation that occurred in the substrate 210.

As illustrated, the non-linear components of deformation on the surface of the substrate 210 include vectors with a variety of directions and sizes. Such marks 213 formed on the surface of the substrate 210 having deformation in the plane direction are displaced in the plane direction of the substrate 210, corresponding to the deformation of the surface of the substrate 210 in the plane direction.

Here, in case where the substrates 210, 230 are aligned, the above described amount of movement, rotation amount, and magnification can be calculated in consideration of displacement due to the non-linear components, by measuring the positions of all of the marks 213 and calculating the relative positions of the substrates 210, 230. However, measuring and calculating a number of marks 213 is not a suitable method for industrial fabrication of the stacked substrate 250, since it significantly increases the processing load and processing time.

On the other hand, in case where a part of the plurality of marks 213, among the plurality of marks 213, is used to align the substrates 210, 230, the alignment accuracy of the substrates 210, 230 may change depending on the selection of the marks 213 to be used for the alignment. For example, in the regions surrounded by the squares W in FIG. 9, the direction of non-linear components of deformation of the substrate 210 include components that are all illustratively facing downward.

Thus, when only the marks 213 disposed in the region surrounded by the squares W are selected and used as the reference for the alignment, the position of the substrate 210 calculated based on the positions of the marks 213 will be biased in the illustratively horizontal direction. Therefore, the alignment accuracy based on the positions of the marks 213 is reduced according to the size, orientation and the like of the displacement of the marks 213 due to the non-linear components of deformation of the substrate 210.

Note that, in the present example, the selection of the marks 213 is performed by the controlling unit 150. That is, in the present example, the controlling unit 150 serves as a selecting unit for selecting the marks 213. Instead of the controlling unit 150 performing the selection of the marks 213, the selecting unit may be provided external to the substrate stacking apparatus 100, and the marks 213 may be pre-selected with the selecting unit by the method described in the present example. In this case, a signal indicating information relating to the marks 213 selected by the selecting unit is sent to the substrate stacking apparatus 100 from the selecting unit, and based on that signal, the controlling unit 150 controls the bonding portion 300 to observe the selected marks 213 with the upper microscope 322 and the lower microscope 342. In this case, a system including a selecting unit and a substrate stacking apparatus 100 may be the stacked substrate stacking system.

Figure 9:
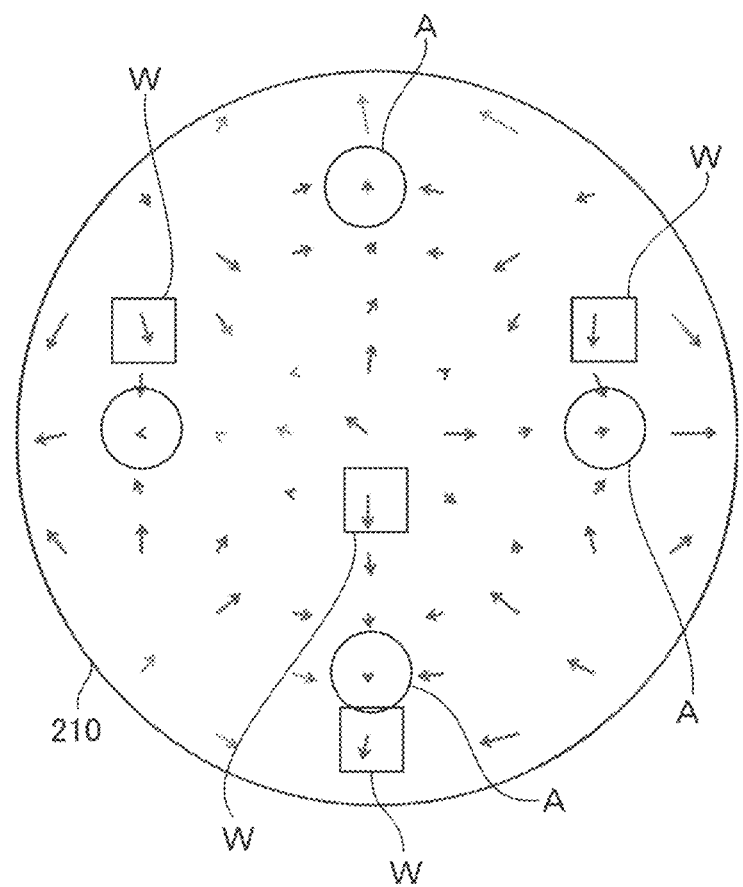
FIG. 9 illustrates the region in which deformation is small in the substrate 210 shown in FIG. 8.

FIG. 9 describes an example of a method for selecting the marks 213 which can reduce the effect of displacement of the marks 213 as described above. In the illustrated substrate 210, the same deformation as the deformation of the substrate 210 shown in FIG. 8 is occurring.

Here, the non-linear components of deformation of the substrate 210 in the regions surrounded by the circles A in the figure have different directions from one another, as indicated by the arrows illustrated in the figure, but the lengths of the arrows corresponding to the amount of deformation is shorter than the lengths of the arrows in other regions. Therefore, although various deformations are occurring in the entire substrate 210, the effect of non-linear components of deformation is reduced in the regions surrounded by the circles A in the substrate 210. Therefore, by using the marks 213 included in the regions surrounded by the circles A to perform the alignment, the effect of the non-linear components on the alignment accuracy can be reduced.

That is, in case where the non-linear components are large, the amount of movement, the rotation amount, and the magnification determined for the alignment will deviate from the optimum value due to the non-linear components. Thus, an effect is caused that the eventual misalignment amount cannot achieve the target alignment accuracy. Therefore, by using the marks 213 disposed in regions in which the non-linear components of deformation that occurred in the substrate 210 is small to calculate the amount of movement of the substrate 230 required for the alignment, the effect of the non-linear components can be reduced and calculation error can be suppressed. A specific method for selecting the marks 213 may include, for example, predetermining a threshold against the size of the non-linear components for the deformation of the substrate, based on the alignment accuracy required for the stacked substrate 250 to be eventually obtained.

In this way, the marks 213 to be used for the alignment can be readily selected, on condition that they are disposed in a region in which the displacement of the points on the substrate 210 due to the non-linear components of deformation that occurred in the substrate 210 is smaller than the predetermined threshold. In addition, the processing becomes easier in case where the process of selecting the marks 213 to be used for the alignment is automatically performed by the controlling unit 150 or the like.

In the above-described example, a case in which a pair of substrates 210, 230 are aligned to form a stacked substrate 250 has been described. However, the above-described selection of the marks 213 can be applied to cases where yet another substrate 260 is stacked onto the stacked substrate 250 (see FIG. 10).

Figure 10:
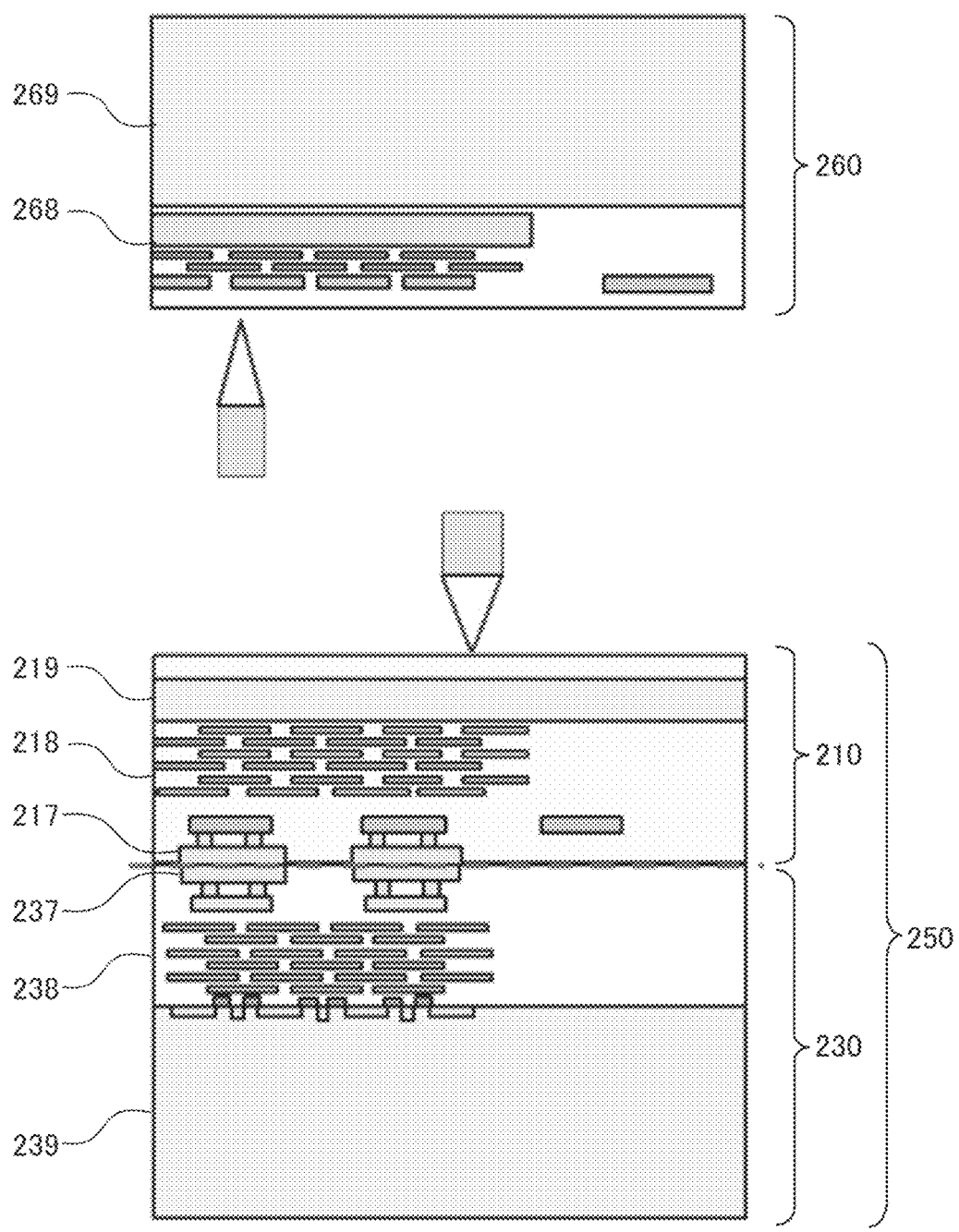
FIG. 10 is a schematic cross sectional view illustrating an example of a substrate 260 to be stacked on a stacked substrate 250.

FIG. 10 illustrates the stacked substrate 250 formed by the substrates 210, 230, and another substrate 260 to be stacked onto the stacked substrate 250, as another example of alignment with part of the marks 213 selected and stacking the substrates. The stacked substrate 250 includes the substrates 210, 230 that have been stacked, and is aligned and stacked according to the procedure shown in FIG. 4.

The substrates 210, 230 each include starting substrates 219, 239, and structure layers 218, 238. The starting substrates 219, 239 are substrates that served as a starting substrate when forming the structure layers 218, 238. The structure layers 218, 238 each include elements, wiring or the like formed by processes such as photolithography. The pair of structure layers 218, 238 is electrically linked at the connection portions 217, 237. In addition, in one of the substrates 210, the starting substrate 219 is thinned.

The substrate 260 to be stacked onto the stacked substrate 250 includes a starting substrate 269 and a structure layer 268. The substrate 260 has the structure layer 268 bonded to the starting substrate 219 of the thinned substrate 210 in the stacked substrate 250.

Figure 11:
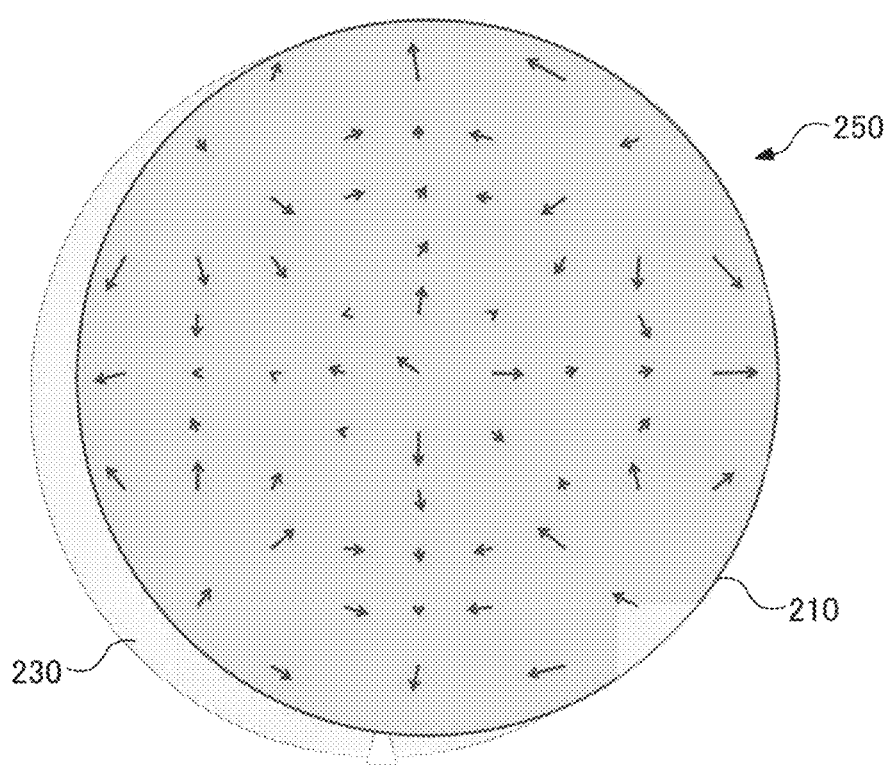
FIG. 11 illustrates the non-linear components of deformation that occurred in the stacked substrate 250.

FIG. 11 illustrates the distribution of deformation occurring in the thinned starting substrate 219 of the substrate 210. As described above, among the substrates 210, 230 stacked in the stacked substrate 250, the substrate 210 is thinned and its stiffness is reduced. Thus, the majority of the distortion that occurred in the substrate 230 due to the bonding of the substrates 210, 230 is transferred to the substrate 210 whose stiffness is reduced due to thinning, and the distortion transferred from the substrate 230 occurs in the substrate 210 in addition to the distortion that the substrate 210 had before the bonding.

Thus, as illustrated, deformation with various non-linear components occurs on the surface of the substrate 210 to be bonded to the substrate 260. However, as described with reference to FIG. 9, alignment with high accuracy with reduced effect of the non-linear components of deformation that occurred in the stacked substrate 250 can be performed, by selecting marks 213 to be used for the alignment of the substrate 260 with the stacked substrate 250 on condition that the non-linear components of deformation is smaller than the threshold.

Note that, in the stacked substrate 250, the structure layer 218 of the substrate 210 and the structure layer 238 of the substrate 230 are aligned to be bonded. On the other hand, the substrate 260 is aligned with the surface of the substrate 210 that is opposite to structure layer 218 in the stacked substrate 250 and stacked thereto. Thus, the marks 213 selected in the stacked substrate 250 when aligning the substrate 260 with the stacked substrate 250 are not necessarily the same as the marks 213 selected in the substrate 210 when aligning the substrate 210 with the substrate 230.

In addition, in one substrate 210, marks 213 that are not the same may refer to marks 213 disposed at different positions in the plane direction of the substrate 210, as well as marks 213 disposed at different positions in the thickness direction of the substrate 210. Further, in the substrate 210, marks 213 that are different from each other may be disposed on the front and back of the substrate 210.

In addition, cases where the marks 213 are not the same include cases where the number of marks 213 used for the alignment is different, such as cases where, when aligning the substrate 260 with the stacked substrate 250, part of the marks 213 selected when aligning the two substrates 210, 230 are selected, or marks 213 formed at different positions are selected in addition to all or part of the marks 213 selected for the alignment of the two substrates 210, 230.

Further, in cases where three or more layers of substrates 210, 230.260 are eventually stacked, in addition to the alignment of adjacent layers, alignment may be performed between the substrates 230, 260 that are separated with other substrates interposed therebetween. In such cases, the marks 213 to be used for the alignment are selected from the marks 213 provided on the to-be-aligned substrates 230, 260.

In addition, in the process of forming the stacked substrate 250, new deformation occurs in the substrates 210, 230 due to the bonding. Here, the distortion that occurred in the entire stacked substrate 250 is distributed proportional the thickness of the substrates 210, 230 forming the stacked substrate 250. Thus, as described above, when only the substrate 210 is thinned and the substrate 230 is not thinned, most of the distortion that occurred in the stacked substrate 250 is aggregated in the substrate 210.

Accordingly, the number of marks 213 selected when stacking the substrate 260 onto the stacked substrate 250 may be increased than the number of marks 213 selected when forming the stacked substrate 250 with the substrates 210, 230. In this way, the alignment accuracy when stacking the substrate 260 onto the stacked substrate 250 can be retained equal to the alignment accuracy when forming the stacked substrate 250.

In the example described with reference to FIG. 9, the marks 213 were selected on condition that they are disposed in regions where the displacement of the points on the substrate 210 due to the non-linear components of deformation that had occurred in the substrate 210 from before the bonding or the non-linear components of deformation that occurred in the substrate 210 due to the bonding is smaller than the predetermined threshold. However, methods for selecting the marks 213 that can reduce the effect of non-linear components of deformation are not limited to the above-described method.

Figure 12:
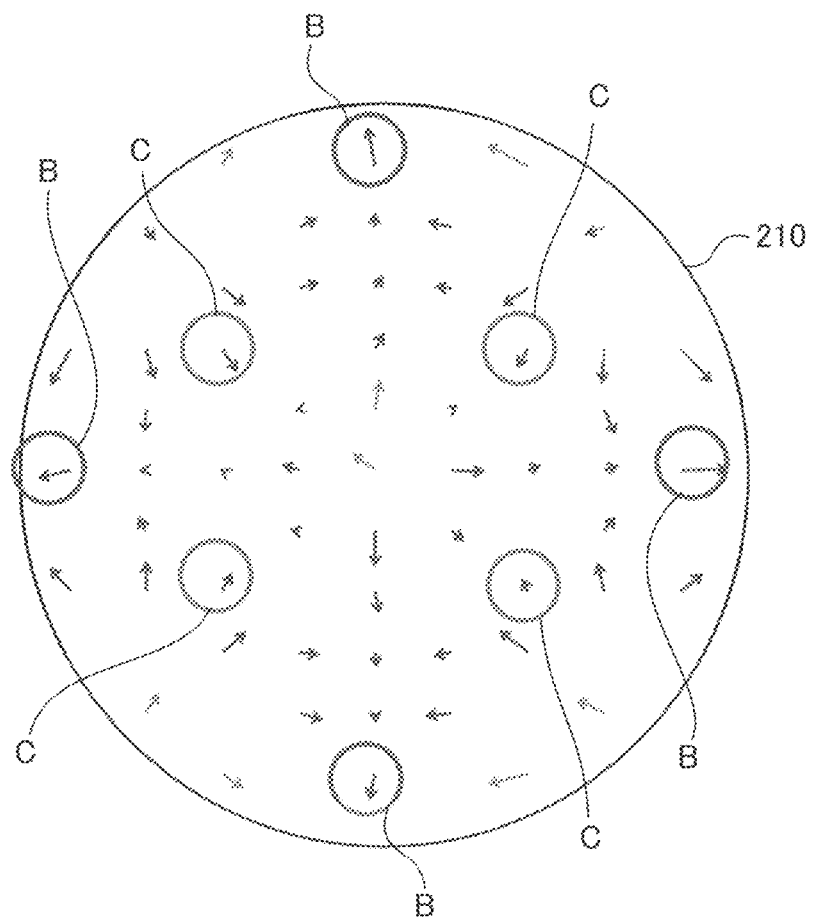
FIG. 12 illustrates the regions in which the marks to be selected 213 are disposed.

FIG. 12 describes another method for selecting marks 213 to be used for the alignment from the marks 213 formed on the substrates 210, 230.260. In this figure, the distribution of non-linear components of deformation on the surface of the substrate 210 that forms the surface that bonds to the substrate 260 in the stacked substrate 250 is illustrated with vectors.

In the illustrated example, marks 213 to be used for the alignment is selected in each of the four regions surrounded by the circles B and four regions surrounded by the circles C. Here, in the regions surrounded by the circles B, the direction of vectors of the non-linear components of deformation that occurred in the substrate 210 is directed outwardly in the radial direction of the substrate 210. In the regions surrounded by the circles C, on the other hand, the direction of vectors of the non-linear components of deformation that occurred in the substrate 210 is directed inwardly in the radial direction of the substrate 210.

In this case, when alignment is performed using the selected marks 213 as a reference such that misalignment is statistically reduced, portions of non-linear components in the deformation of the substrate 210 cancel each other. That is, portions of the calculation error that occurs due to non-linear components in the amount of movement, the rotation amount, and the magnification calculated using the marks 213 disposed in the regions surrounded by the circles B and the calculation error that occurs due to the non-linear components in the amount of movement, the rotation amount, and the magnification calculated using the marks 213 disposed in the regions surrounded by the circles C cancel each other. Therefore, regardless of whether there is a variation in the size and orientation of each of the non-linear components of the plurality of substrates 210 among the plurality of substrates 210, that is, whether the reproducibility is high or low, the marks 213 to be used for the alignment may be selected provided that the selection includes a combination such that components that cancel the effects of each other due to the non-linear components of deformation of the substrate 210 are included.

In this way, effects of displacement of the marks 213 due to non-linear components of deformation that had occurred to the substrate 210 before the bonding or non-linear component of deformation that occurred to the substrate 210 due to the bonding can be suppressed. The threshold may be defined on condition that the bonding deviation that eventually occurs can achieve a target bonding accuracy, and marks 213 at locations at which vectors were measured to be smaller than that threshold may be selected.

Note that, when selecting the marks 213, a method for measuring the non-linear components of the distortion that is occurring in the substrates 210, 230, 260, and the stacked substrate 250 may include actually measuring the displacement of the marks 213 relative to the designed position before the bonding for the substrates 210, 230, 260, and the stacked substrate 250. In this case, preferably displacement of all the marks 213 formed on the substrates 210, 230, 260, and the stacked substrate 250 is measured, but displacement of a fewer number of marks 213 than the total number of marks 213 may be measured. For the individual substrates 210, 230, 260, displacement of the marks due to the non-linear components of initial distortion before bonding is measured, and for the stacked substrate 250, displacement of the marks due to the non-linear components of distortion that occurred due to the bonding of the plurality of substrates that forms the stacked substrate 250 is measured.

The distribution of non-linear components measured for the substrates 210, 230, 260, and the stacked substrate 250 may be applied to a substrate or stacked substrate with the same lot as the measured substrates 210, 230, 260 and the stacked substrate 250, a substrate or stacked substrate fabricated with the same process, or a substrate or stacked substrate having same structures. In this case, in the substrates 210, 230, 260 and the stacked substrate 250 in which the distribution of non-linear components is measured, based on the positions of the selected marks 213 to be measured, displacement due to non-linear components may be measured in a region including those positions. In this way, compared to cases where distribution of non-linear components is measured for the entirety of the substrates 210, 230, 260 and the stacked substrate 250, the measurement time can be reduced.

In addition, based on information relating to distortion, such as materials, specifications, manufacturing process conditions, crystal orientations, and shapes, including bending, of the substrates 210, 230, 260 and the stacked substrate 250, the distribution of non-linear components may be estimated from the relation between such information and the distribution of non-linear components, or by analysis. In addition, for the stacked substrate 250, the state of distortion that occurs when a plurality of substrates forming the stacked substrate 250 is bonded may be predicted based on information relating to distortion, such as manufacturing condition and bending, and based on the above, the distribution of non-linear components may be estimated.

In the above-described example, selection of marks 213 on condition that it includes a combination that cancels the displacement of the marks 213 due to non-linear components of deformation has been described. However, the marks 213 to be used for the alignment can be selected in yet another method.

Figure 13:
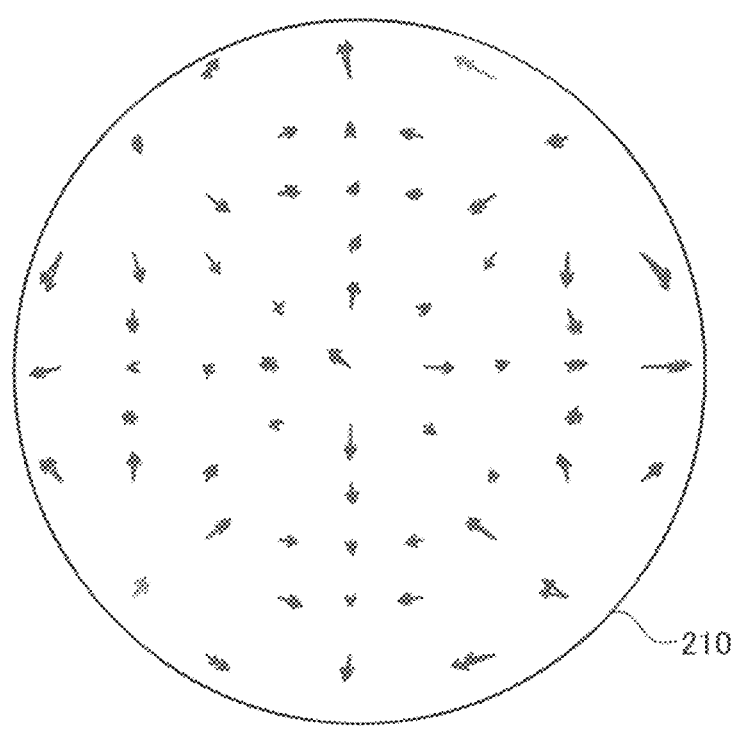
FIG. 13 illustrates the fluctuation of the non-linear components in the substrate 210.

FIG. 13 illustrates a plurality of overlaying diagrams representing the non-linear components in the deformation of the substrate 210 with vectors. More specifically, FIG. 13 illustrates a state in which vectors indicating the distribution of non-linear components generated in each substrate 210 when three substrates 210 are each bonded to another substrate are overlaid.

As illustrated in this figure, in some regions of the substrate 210, non-linear components constantly having substantially the same size and direction are generated. Therefore, the marks 213 disposed in this region may be selected as the marks 213 to be used for the alignment. That is, some marks 213 to be used for the alignment may be selected from a number of marks 213 disposed on the substrate 210, on condition that they are disposed in a region in which the reproducibility of the non-linear components of deformed that occurs in the substrate 210 is higher than a predetermined threshold. The above-described threshold may be defined on condition that the bonding deviation in the stacked substrate 250 that is eventually obtained can achieve a target bonding accuracy.

Note that, in case where a plurality of stacked substrates 250 are manufactured, the same marks 213 may be used at the alignment step of the stacked substrate 250 during a period in which the reproducibility of the non-linear components does not change. In addition, the distribution of reproducibility of the non-linear components for each of the predetermined number of substrates may be measured to update the designation of the marks 213 to be used. In this way, high alignment accuracy can be maintained continuously.

The calculation error in the amount of movement, the rotation amount, and the magnification due to non-linear components becomes a value having reproducibility, if the region in which the marks 213 selected to be used for the alignment is disposed is a region in which distribution of the non-linear components of deformation among the plurality of substrates 210 has reproducibility. Thus, after the second bonding, the amount of movement, the rotation amount, and the magnification of the substrate 210 required for the alignment are calculated at the alignment step in consideration of the displacement of the marks 213 due to the non-linear components of deformation that is occurring to one of the substrates 210. That is, the effect of non-linear components can be suppressed by pre-calculating the size and orientation of the non-linear components having high reproducibility as the offset amount against the relative position calculated for the alignment. In addition, if there is reproducibility in the calculation error that occurs due to the non-linear components to the calculated amount of movement, rotation amount, and magnification among the plurality of substrates 210, the marks 213 formed in corresponding regions among the plurality of substrates 210 may be selected as the marks 213 to be used for the alignment, even in regions in which there is no reproducibility (i.e. there is deviation) in the distribution of the non-linear components of deformation among the plurality of substrates 210.

Figure 14:
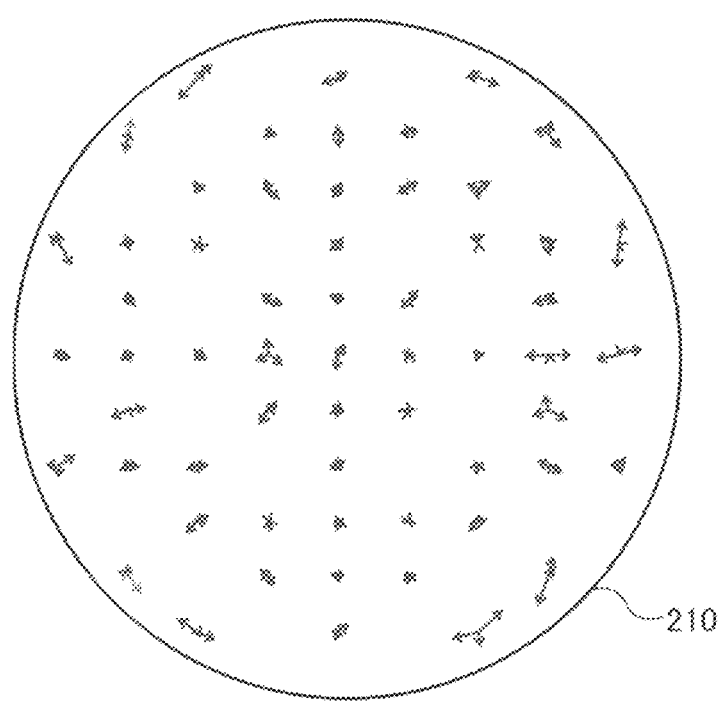
FIG. 14 is another figure illustrating the fluctuation of the non-linear components in the substrate 210.

FIG. 14 illustrates another display for learning the reproducibility of the non-linear components shown in FIG. 13. In the illustrated example, the vectors of the non-linear components that occur in each substrate 210 when three substrates 210 are each bonded with another substrate is expressed by the difference relative to the average value at each point in each substrate 210 and displayed being overlaid. In this way, the regions in which the reproducibility of non-linear components is high in the substrate 210 become easier to be found.

Figure 15:
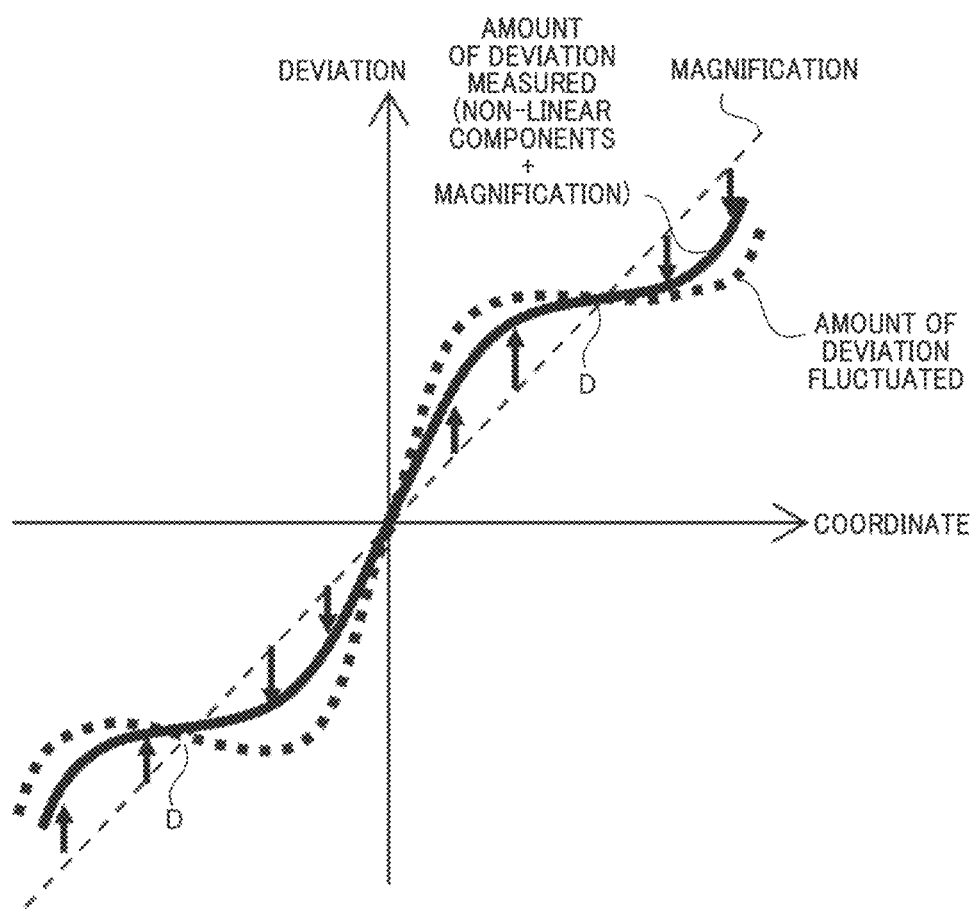
FIG. 15 is a graph illustrating the distribution of the non-linear components of deformation of the substrate 210.

FIG. 15 is a graph in which the coordinate on the horizontal axis represents the position in the radial direction of the substrate 210, and the measurement result of the displacement due to the magnification in the deformation of the substrate 210 and the non-linear components in a certain fluctuation mode is plotted as deviation on the vertical axis. The origin of the illustrated orthogonal coordinate becomes the center of the substrate 210.

In this figure, the linear components of deformation that occurred to the substrate 210 are displayed as the magnification by the dashed straight line. In addition, the solid curved line indicates the actual measurement value of the displacement of points on the substrate 210 due to the non-linear components and the magnification of deformation. The vertical arrows depicted between the straight line (dashed) and the curved line (solid) corresponds to the size of the non-linear components of deformation that occurred to the substrate 210.

As illustrated, the non-linear components of this fluctuation mode fluctuates from illustratively upper side to the lower side relative to the straight line of the magnification, and then fluctuates to the upper side and lower side, towards the larger coordinate along the radial direction of the substrate 210. Thus, other than at the origin of the coordinate, the curved line intersects twice with the straight line at the intersections D. At such intersections D, as illustrated in the figure with a dotted curved line, the change in the amount of deformation due to the non-linear components is small, even when the size of the non-linear components changes in different substrates. Therefore, the regions in which there is less change in the non-linear components of each of the fluctuation modes are regions with high reproducibility of non-linear components, and marks 213 suitable for the alignment can be selected from those regions.

Figure 16:
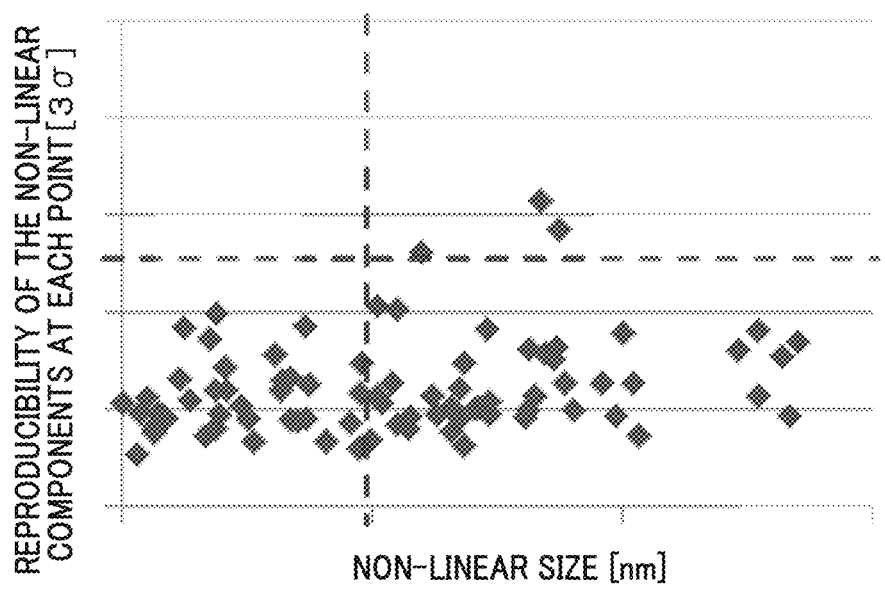
FIG. 16 is a graph describing the reproducibility of the non-linear components.
Figure 17:
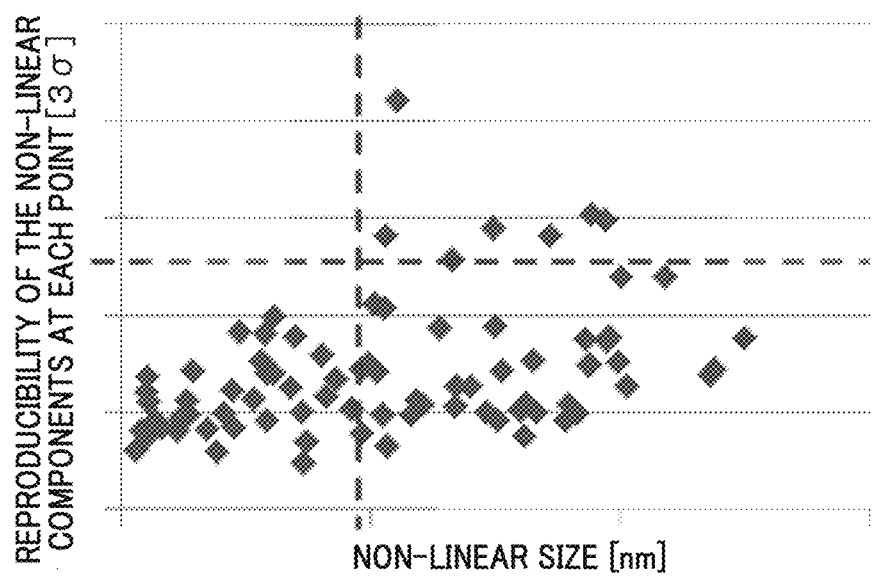
FIG. 17 is a graph describing the reproducibility of the non-linear components.

FIG. 16 and FIG. 17 are graphs describing the reproducibility of non-linear components that occurred in the substrate 210. FIG. 16 shows the X-direction components of deformation and FIG. 17 shows the Y-direction components of deformation. These figures are graphs in which the relation between the non-linear size which is the displacement amount (length [nm]) of the non-linear components at points on the substrate 210 due to deformation of the substrate 210 and the deviation (standard deviation 3σ) at each point is plotted for ten substrates 210 held in a certain substrate holder 220. The dotted line in the figures indicates an example of thresholds for the reproducibility and a range of non-linear sizes at which said reproducibility can be acquired at a higher probability. In the region on the left hand lower side of the figure in which the non-linear size is small, the reproducibility of the non-linear components tend to be high.

As described above, the regions in which deformation due to the non-linear components of deformation of the substrate 210 is small may also be regions in which reproducibility of the non-linear components of deformation that occurs in the substrate 210 is high. Therefore, the regions in which the non-linear components of deformation that occurred in the substrate 210 is small may be regions in which reproducibility of the non-linear components is high. From such perspective, marks 213 disposed in regions in which deformation due to the non-linear components of the substrate 210 is small are preferably selected as the marks 213 to be used for the alignment of the substrate 210.

Figure 18:
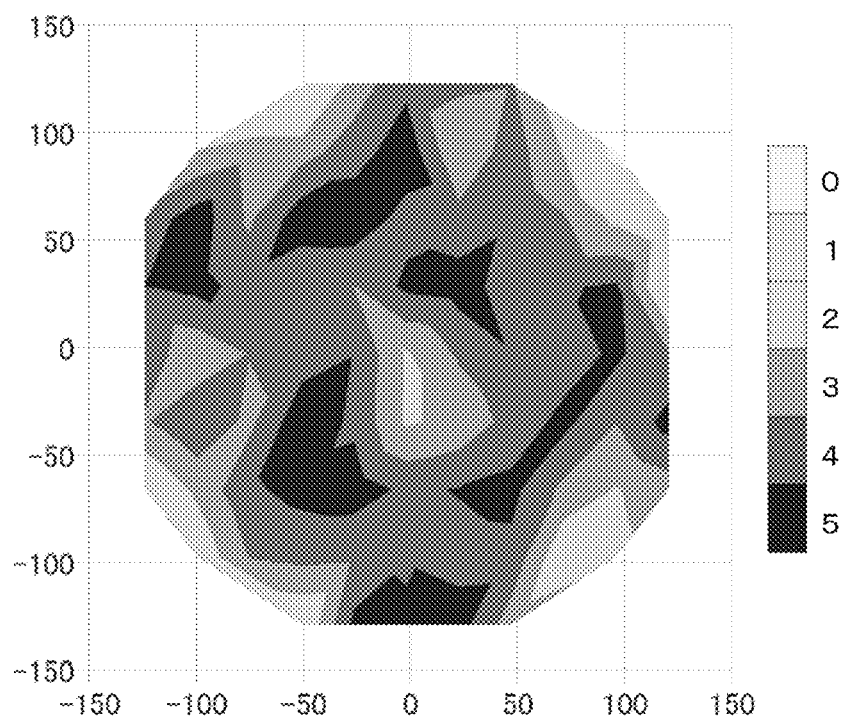
FIG. 18 is a graph describing the distribution of the reproducibility of the non-linear components.
Figure 19:
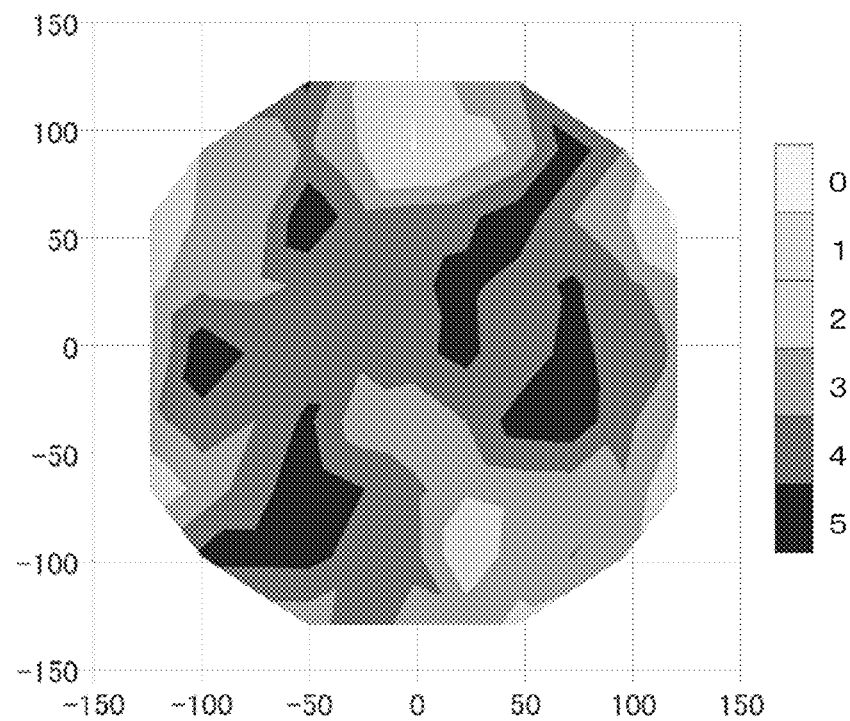
FIG. 19 is a graph describing the distribution of reproducibility of the non-linear components.

FIG. 18 is a graph showing the distribution of reproducibility measured for the X-direction components due to the non-linear components in the deformation of the substrate 210. In addition, FIG. 19 is a graph showing the distribution of reproducibility measured for the Y-direction components of the non-linear components in the deformation of the substrate 210. In both figures, the regions with deep color are regions in which fluctuation of the non-linear components is small and reproducibility is high.

As described above, the effect of the non-linear components on the alignment accuracy can be suppressed by selecting the marks 213 to be used for the alignment from regions with high reproducibility of non-linear components. Therefore, by selecting marks 213 disposed in regions in which regions of deep color in FIG. 18 and regions of deep color in FIG. 19 overlap, alignment with suppressed effect of the non-linear components is enabled. Specifically, for example, a threshold is defined according to the target value of alignment accuracy required for the stacked substrate 250 to be eventually obtained, and marks 213 disposed within regions that can achieve the alignment accuracy without exceeding the defined threshold is selected.

Alternatively, the marks 213 in regions with high reproducibility in the X-direction are selected from the distribution of the non-linear components in the X-direction shown in FIG. 18, and alignment is performed only in the X-direction by using the selected marks 213 as a reference such that misalignment is statistically reduced. In this way, alignment can be performed without the effect of the non-linear components of deformation of the substrate 210 for the X-direction of the substrate 210.

In addition, the marks 213 in regions with high reproducibility in the Y-direction are selected from the distribution of the non-linear components in the Y-direction shown in FIG. 19, and alignment is performed only in the Y-direction by using the selected marks 213 as a reference such that misalignment is statistically reduced. In this way, alignment can be performed without the effect of the non-linear components of deformation of the substrate 210 for the Y-direction of the substrate 210.

In this way, alignment can be performed for each of the X-direction and the Y-direction intersecting with the X-direction, and thus, alignment can be performed two-dimensionally in the plane direction of the substrate 210 by using the marks 213 as a reference. In addition, since marks 213 can be selected individually for the X-direction and the Y-direction, the flexibility for the selection of marks 213 in the substrate 210 becomes high. That is, as can be seen by comparing FIG. 18 and FIG. 19, in case where there is a region with high reproducibility of non-linear components in the X-direction but low reproducibility of non-linear components in the Y-direction, for example, only the high reproducibility for the X-direction can be effectively utilized.

Note that, when selecting the marks 213, in the radial direction of the substrate 210, the marks 213 located closer to the edge side of the substrate 210 is preferably selected. In this way, the alignment accuracy by the marks 213 can be further improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An alignment method for aligning two substrates to be stacked, comprising:
   acquiring information of deformation of at least one substrate of the two substrates, wherein a plurality of marks, each of which is an indicator for alignment, are disposed on the at least one substrate;
   selecting marks from the plurality of marks based on the information;
   measuring a position of each of the selected marks; and
   aligning the two substrates based on the measured positions of the selected marks such that misalignment between the two substrates is reduced,
   wherein the information includes sizes of non-linear components of the deformation, and
   wherein the aligning the two substrates includes aligning the two substrates based on amount of movement of the at least one substrate, the amount of movement being calculated based on the positions of the selected marks.

2. A method for stacking substrates, comprising:
   aligning the two substrates using the alignment method according to claim 1; and
   bonding the aligned two substrates.

3. The alignment method according to claim 1,
   wherein the selected marks are marks each of which is disposed on a region whose non-linear component size of the deformation of the at least one substrate is smaller than a threshold.

4. The alignment method according to claim 1,
   wherein the selected marks are marks each of which is disposed on a region whose non-linear component reproducibility of the deformation of the at least one substrate is higher than a threshold.

5. An alignment apparatus for aligning two substrates to be stacked, comprising:
   an acquiring unit configured to acquire information of deformation of at least one substrate of the two substrates;
   a selecting unit configured to select marks from the plurality of marks based on the information;
   a measuring unit configured to measure a position of each of the selected marks; and
   an aligning unit configured to align the two substrates based the measured positions of the selected marks such that misalignment between the two substrates is reduced,
   wherein the information includes sizes of non-linear components of the deformation, and
   wherein the aligning the two substrates includes aligning the two substrates based on amount of movement of the at least one substrate, the amount of movement being calculated based on the positions of the selected marks.

6. The alignment apparatus according to claim 5,
   wherein the selected marks are marks each of which is disposed on a region whose non-linear component size of the deformation of the at least one substrate is smaller than a threshold.

7. The alignment apparatus according to claim 5,
   wherein the selected marks are marks each of which is disposed on a region whose non-linear component reproducibility of the deformation of the at least one substrate is higher than a threshold.

8. The alignment apparatus according to claim 6, wherein the threshold is determined by at least one of a target alignment accuracy or bonding accuracy of the two substrates.

9. A substrate stacking apparatus comprising:
the alignment apparatus according to claim 5; and
a bonding portion configured to bond the two substrates that is aligned by the alignment apparatus.

10. The substrate stacking apparatus according to claim 9, comprising an activation apparatus configured to activate a bonded surface of the two substrates before or after aligning the two substrates with the alignment apparatus.

11. A stacked substrate manufacturing system comprising:
an acquiring unit configured to acquire information of deformation of at least one substrate of two substrates to be stacked, wherein a plurality of marks, each of which is an indicator for alignment, are disposed on the at least one substrate;
a selecting unit configured to select marks from the plurality of marks based on the information;
a measuring unit configured to measure a position of each of the selected marks; and
a substrate stacking apparatus configured to bond the two substrates based on the measured positions of the selected marks,
wherein the information includes sizes of non-linear components of the deformation, and
wherein the aligning the two substrates includes aligning the two substrates based on amount of movement of the at least one substrate, the amount of movement being calculated based on the positions of the selected marks.

12. The alignment method according to claim 1, wherein the information is measured at a manufacturing step of the at least one substrate.

13. The alignment method according to claim 1, wherein the information further includes at least one of an exposure condition for an exposure apparatus, a film forming condition for a film forming apparatus, a grinding condition for a grinding apparatus, and an activating condition for an activation apparatus.

14. The alignment method according to claim 1, wherein the at least one substrate is a stacked substrate formed by stacking a plurality of substrates.

15. The alignment method according to claim 1,
wherein the aligning the two substrates include:
moving one substrate of the two substrates relative to the other substrate of the two substrates in a direction along a bonding surface of one of the two substrates, based on the measured positions of the selected marks.

16. The alignment method according to claim 1,
wherein the information includes a distribution of sizes of non-linear components of the deformation.

17. The alignment method according to claim 5,
wherein the measuring unit configured to move one substrate of the two substrates relative to the other substrate of the two substrates in a direction along a bonding surface of one of the two substrate, based on the measured positions of the selected marks.

18. The alignment method according to claim 5,
wherein the information includes a distribution of sizes of non-linear components of the deformation.

* * * * *